United States Patent [19]
Baudelot et al.

[11] Patent Number: 5,212,619
[45] Date of Patent: May 18, 1993

[54] METHOD AND SYSTEM FOR PROTECTING A GATE CONTROLLED THYRISTOR AGAINST UNACCEPTABLE OVERVOLTAGE

[75] Inventors: Eric Baudelot, Erlangen; Hans Laber, Erlangen-Bruck, both of Fed. Rep. of Germany

[73] Assignee: Siemens Aktiengesellschaft, Munich, Fed. Rep. of Germany

[21] Appl. No.: 621,888

[22] Filed: Dec. 4, 1990

[30] Foreign Application Priority Data

Dec. 8, 1989 [EP] European Pat. Off. ............ 89122721.7

[51] Int. Cl.⁵ ............................................. H02H 3/20
[52] U.S. Cl. ...................................... 361/91; 361/18; 361/56
[58] Field of Search ............... 361/18, 56, 88, 91; 363/58; 307/633

[56] References Cited

U.S. PATENT DOCUMENTS

| | | | |
|---|---|---|---|
| 4,115,707 | 9/1978 | Kalfus | 307/633 |
| 4,275,430 | 6/1981 | Seki | 361/91 |
| 4,392,175 | 7/1983 | Takigami | 361/88 |
| 4,417,156 | 11/1983 | Fukui | 307/633 |
| 4,587,438 | 5/1986 | Murakami | 307/633 |
| 4,682,278 | 7/1987 | Marquardt et al. | 363/58 |

FOREIGN PATENT DOCUMENTS 0176800 4/1986 European Pat. Off.
3311426 10/1984 Fed. Rep. of Germany.

OTHER PUBLICATIONS

Elektronik, vol. 33, No. 20, Oct. 5, 1984, pp. 111-115, Munich, W. Germany; A. Honda; "Optimierte Ansteuerschaltungen für GTO-Thyristoren", Part 1.
Elektronik, vol. 33, No. 21, Oct. 19, 1984, pp. 91-96, Munich, W. Germany; A. Honda; "Optimierte Ansteuerschaltungen für GTO-Thyristoren", Part 2.
Elektroniker, No. 5, 1984, pp. 49-56: "Abschaltbare Hochleistungsthyristoren (GTOs) für den Anwenderheute".
BBC-Nachrichten, 1977, Heft ⅜, pp. 152-158: "Thyristorschutz mit Halbleitern-wirtschaftlich und sicher".

Primary Examiner—Steven L. Stephan
Assistant Examiner—Adolf Berhane
Attorney, Agent, or Firm—Kenyon & Kenyon

[57] ABSTRACT

Protecting a gate fully controlled thyristor that is controlled by a drive circuit including a turn-on circuit and a turn-off circuit against overvoltage, is accomplished by monitoring the anode voltage of said gate fully controlled thyristor relative to its cathode voltage. Upon overshoot of the voltage of a predetermined limit, a control signal is generated. This control signal causes the negative voltage source that is connected at the gate of the gate fully controlled thyristor to turn off. The gate fully controlled thyristor is then turned on by means of the turn-on circuit.

43 Claims, 8 Drawing Sheets

METHOD AND SYSTEM FOR PROTECTING A GATE CONTROLLED THYRISTOR AGAINST UNACCEPTABLE OVERVOLTAGE

BACKGROUND OF THE INVENTION

The invention relates generally to gate fully controlled thyristors controlled by a drive circuit, including a turn-on circuit and a turn-off circuit, and more specifically to a method and system for protecting such gate fully controlled thyristors from unacceptable overvoltage.

The journal "Elektronik", No. 20, of Oct. 5, 1984, pages 111 to 115, and the journal "Elektronik", No. 21, of Oct. 19, 1984, pages 91 to 96, discloses an optimized drive circuit, consisting of a turn-on circuit and a turn-off circuit, for gate fully controlled thyristors (Gate-Turn-Off thyristors or GTO thyristors), in particular gate fully controlled power thyristors. The first-named article discusses the turn-on circuit, the second article discusses the turn-off circuit.

The journal "Elektroniker", No. 5, 1984, pages 49 to 56, in particular page 52, discloses a control generator for a high power GTO thyristor. This control generator contains a turn-on circuit, a turn-off circuit, and a blocking circuit which supplies the gate of the high-power GTO thyristor with a negative gate voltage during the blocking phase. The control generator is constructed with power metal oxide semiconductor field effect transistors (power MOSFET).

The journal "BBC-Nachrichten", 1977, No. 3/4, pages 152 to 158, discloses protective measures for a thyristor. Voltage-limiting elements, as e.g. varistors (silicon-carbide varistor, oxide varistor), two anti-series connected surge-proof silicon diodes (BBC-DASAS elements) or breakover diodes (BOD) are used as protective elements BOD elements are thyristors dimensioned to defined breakover voltages without an external gate terminal They ignite by overshoot of the null breakover voltage and fire the thyristor to be protected to whose anode-gate path a BOD element is connected in parallel.

This protective measure, where a BOD element with a series resistor links the anode of the thyristor to be protected with its gate, cannot be used as protective measure for GTO thyristors as the GTO thyristor is kept in the blocked state by a negative gate voltage. With the use of a BOD element, as in the overvoltage protection of a thyristor, the current through the BOD element would, in response to overvoltage, flow off into the negative voltage source and would not become effective as ignition current. That is, the overvoltage protection constructed with a voltage-limiting element, connected in parallel to the anode-gate path of the GTO thyristor, as in the overvoltage protection for thyristors, would not be able to protect a GTO thyristor against overvoltages.

Therefore, there is a need to develop a method and system for protecting a GTO thyristor against unacceptable overvoltage.

SUMMARY OF THE INVENTION

According to the present invention, this problem is solved by monitoring the voltage across the GTO thyristor, generating a control signal when a predetermined limit is exceeded, turning off the negative voltage source connected at the gate, and turning on the GTO thyristor by means of the turn-on circuit.

It is possible to effectively protect the gate fully controlled thyristor against overvoltage by using the control signal as an actuating signal for the turn-off circuit and the turn-on circuit. The control signal is generated as a function of the voltage across the GTO thyristor. The generated control signal disconnects the negative voltage source present at the gate and activates the turn-on circuit, which fires the gate fully controlled thyristor before it is destroyed by overvoltage.

In an advantageous method, the control signal or the control current is additionally supplied to the gate of the gate fully controlled thyristor as ignition current, so that it fires. Due to the fact that the turn-off circuit is turned off, i.e. the negative voltage source connected to the gate of gate fully controlled thyristor is turned off, the control signal or the control current can no longer flow off into the negative voltage source. Rather, the control current is used for turning the turn-on circuit on. This method causes the gate fully controlled thyristor to fire, even if the turn-on circuit is defective, so that the existing overvoltage cannot destroy the gate fully controlled thyristor To protect a gate fully controlled thyristor against overvoltage, in which the gate fully controlled thyristor is controlled by a drive circuit consisting of a turn-on circuit, a turn-off circuit and a blocking circuit, another method monitors the voltage across the gate fully controlled thyristor. When a predetermined limit value is exceeded, a control signal is generated which is supplied to the gate of the gate fully controlled thyristor as ignition current. With the turn-off circuit turned off, the gate-cathode path of the gate fully controlled thyristor has lower impedance than the blocking circuit, which divides the control signal or the control current inversely relative to the ratio of the resistance values. Also with this method the control signal or control current cannot flow into the negative voltage source, but is supplied predominantly to the gate of the gate fully controlled thyristor as ignition current.

To implement the method of the present invention, for a gate fully controlled thyristor that is controlled by a drive circuit including a turn-on circuit and a turn-off circuit, a system connects a series arrangement in parallel with the anode-cathode path of the gate fully controlled thyristor. The series arrangement includes a voltage-limiting element and a transmitting portion of a coupling element. The receiving portion of the coupling element is connected to the actuating input of the turn-off circuit and of the turn-on circuit in such a way that the turn-off circuit can be turned off and the turn-on circuit turned on. The generated control signal on the receiving portion of the coupling element bridges the actuating input of the turn-off circuit and drives a switch of the turn-on circuit. The switch turns the turn-off circuit off and the turn-on circuit on. With the turn-on circuit turned on, the gate fully controlled thyristor is ignited, removing the overvoltage at the gate fully controlled thyristor.

To implement the method of the present invention, for a gate fully controlled thyristor that is provided with a protective circuit including a diode, a resistor and a capacitor and with an driving circuit including a turn-on circuit and a turn-off circuit, a system connects a series arrangement to the capacitor of the protective circuit. The series arrangement includes a voltage-limiting element and a transmitting portion of a coupling element. A receiving portion of the coupling element is connected to the actuating input of a switch that turns the turn-off circuit off and the turn-on circuit on. In this system, the voltage at the capacitor of the protective circuit of the gate fully controlled thyristor is monitored with respect to the cathode voltage of the gate fully controlled thyristor. If this voltage exceeds a predetermined limit, a control signal is generated. The control signal by means of a switch, turns the turn-off circuit off and the turn-on circuit on.

To implement the method of the present invention for a gate fully controlled thyristor provided with a driving circuit, including a turn-on circuit and a turn-off circuit, another advantageous system links the anode of the gate fully controlled thyristor with its gate via a series arrangement. The series arrangement includes a voltage-limiting element, a transmitting portion a coupling element and a decoupling diode. A receiving portion of the coupling element is connected to the actuating input of a switch that turns the turn-off circuit off and the turn-on circuit on. In this system, the generated control signal or the control current is also supplied to the gate of the gate fully controlled thyristor as ignition current. Thus a gate fully controlled thyristor can be protected against inadmissible over-voltage even if the turn-on circuit is defective.

This additional protective measure is employed also in the system that monitors the voltage at the capacitor of the protective circuit of the gate fully controlled thyristor.

To implement another method of the present invention, for a gate fully controlled thyristor that is controlled by a driving circuit including a turn-on circuit and a turn-off circuit, a system connects an ignition thyristor with a series resistor in parallel with the anode-gate path of the gate fully controlled thyristor. The gate of the ignition thyristor is linked —via a series arrangement including a voltage limiting element and a transmitting portion of the coupling element—with the anode of the gate fully controlled thyristor. The receiving portion of the coupling element is connected to the actuating input of a switch that turns the turn-off circuit off and the turn-on circuit on. In this system, upon overvoltage, the gate fully controlled thyristor is fired by means of an overvoltage-protected thyristor whose voltage endurance corresponds to the voltage endurance of the gate fully controlled thyristor. In this way, the turn-off circuit is turned off and the turn-on circuit turned on at the same time. Thus, even if the turn-on circuit is defective, the gate fully controlled thyristor is protected against inadmissible overvoltage by the protective ignition of the gate fully controlled thyristor by means of the ignition thyristor.

To implement another method of the present invention for a gate fully controlled thyristor that is controlled by a driving circuit including a turn-on circuit, a turn-off circuit and a blocking circuit, a system connects a series arrangement in parallel with the anode-gate path of the gate fully controlled thyristor. The series arrangement includes a voltage-limiting element and a resistor. Since the driving circuit has a blocking circuit, that connects the negative voltage source to the gate at higher impedance than in the turn-off circuit, and the gate-cathode path of the gate fully controlled thyristor has lower impedance than the blocking circuit, the generated control signal is supplied predominantly as ignition current to the gate of the gate fully controlled thyristor (current-amplitude ratio inversely proportional to the resistance ratio). Hence there is no need to turn off the turn-off circuit and to turn on the turn-on circuit.

DETAILED DESCRIPTION

In FIGS. 1 to 9 like elements are given the same reference symbols.

Figure 1:
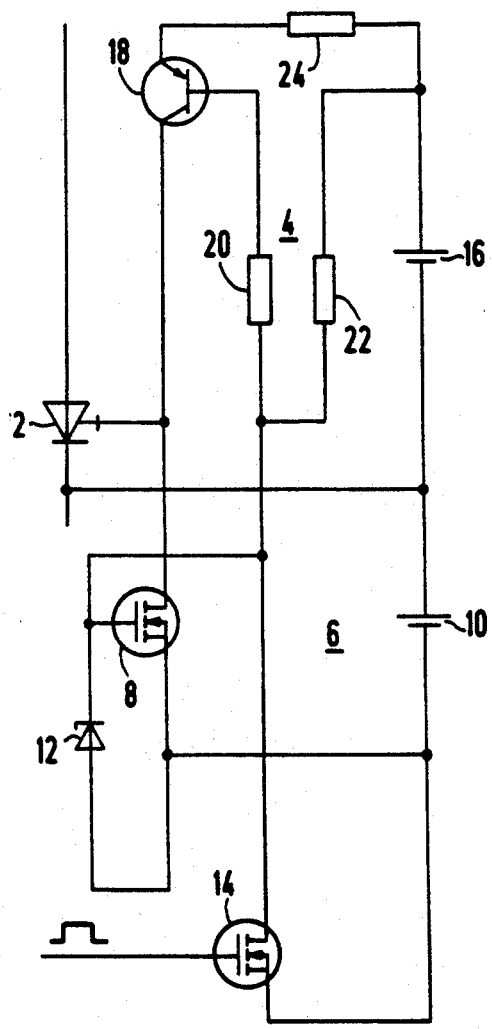
FIG. 1 shows a gate fully controlled thyristor with a known drive circuit.

FIG. 1 illustrates a drive circuit for a GTO thyristor 2. The drive circuit contains a turn-on circuit 4 and a turn-off circuit 6. The turn-off circuit 6, which during the blocking phase supplies the gate of the GTO thyristor 2 with a negative gate voltage, includes a enhancement MOSFET 8 and a voltage source 10. A Zener diode 12 is connected in parallel with the gate-source path of MOSFET 8, so that the gate voltage is limited. The turn-on circuit 4 includes a enhancement MOSFET 14, a voltage source 16, and a pnp transistor 18. The base of the pnp transistor is connected via a resistor 20 to the drain terminal of the enhancement MOSFET 14 and via a resistor 22 to the positive pole of the voltage source 16. The voltage source 16 is electrically connected to the emitter of the pnp transistor 18 by means of a resistor 24. The enhancement MOSFET 14 receives a make signal from a control device (not shown in detail). This make signal causes MOSFET 14 to conduct and MOSFET 8 to block, since its gate terminal is connected to the drain terminal of the enhancement MOSFET 14 of the turn-on circuit 4. At a control signal, the enhancement MOSFET 14 is blocked and the enhancement MOSFET 8 becomes conducting due to the blocked state of the enhancement MOSFET 14. The gate potential of the enhancement MOSFET 8 of the turn-on circuit 4, and hence its drain potential, is clamped to a predetermined value by means of the Zener diode 12. During the blocking phase the MOSFET 8 remains conducting, thus the voltage source 10 is connected to the gate of the GTO thyristor 2, and the GTO thyristor 2 remains blocked.

Figure 2:
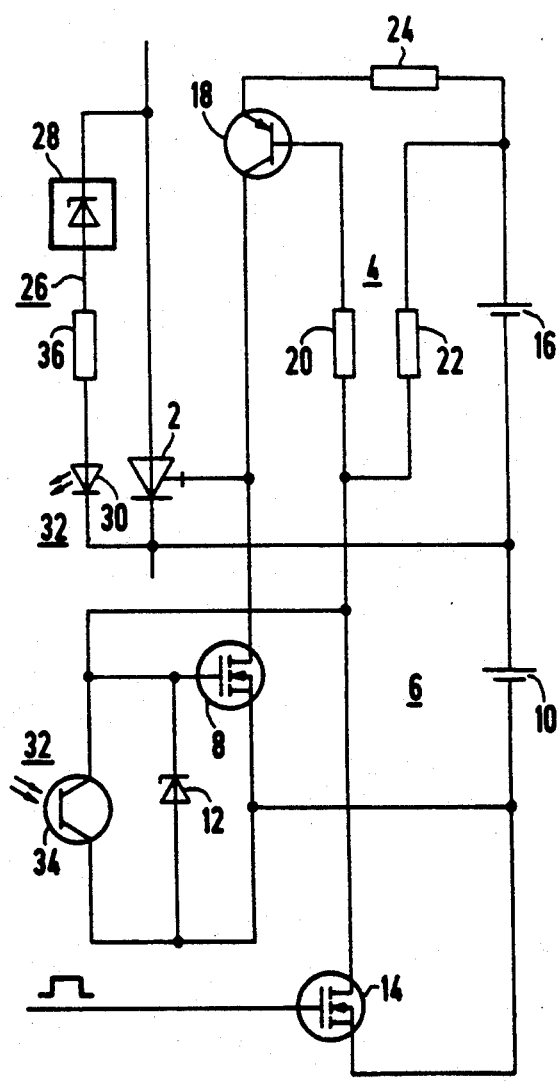
FIGS. 2 to 5 show systems that implement the method of the present invention.

FIG. 2 depicts a system implementing the method of the present invention. Referring to FIG. 2, along with the known drive circuit per FIG. 1, the gate fully controlled thyristor 2 is connected in parallel with a series arrangement 26 at the anode-cathode terminals of the GTO thyristor 2. The series arrangement 26 consists of a voltage-limiting element 28 and a transmitting portion 30 of a coupling element 32. The receiving portion 34 of the coupling element 32 is connected in parallel with the gate-source path of the enhancement MOSFET 8 of the turn-off circuit 6 of the drive circuit. A light-emitting diode (LED) and a photo-transistor are provided as the transmitting and receiving portions, respectively, of the coupling element 34, which are coupled to each other by means of a light waveguide. A breakover diode with a resistor may be provided as the voltage-limiting element 28. Breakover diodes (BOD) are thyristors dimensioned to defined breakover voltages without an external gate terminal. They ignite by overshoot of the null breakover voltage. Additional voltage limiting elements 28 can be a varistor with a trigger diode connected in series, also called Diac, or a Zener diode with a series-connected trigger diode. With these combinations one obtains voltage limiting elements 28 which show a characteristic like a breakover diode.

By means of the voltage limiting element 28, the anode voltage of the GTO thyristor 2 is monitored relative to its cathode voltage. If the anode voltage of the GTO thyristor 2 exceeds a limit value set by means of the voltage limiting element 28, the voltage limiting element 28 ignites and a control signal or a control current begins to flow. By means of the transmitting portion 30 of the coupling element 32, this control current is transformed into a light signal, which causes the receiving portion 34 of the coupling element 32 to conduct, whereby the gate-source path of the enhancement MOSFET 8 of the turn-off circuit 6 is bridged. This causes the enhancement MOSFET 8 to go into the blocked state, whereby the negative voltage source 10 is disconnected from the gate of the GTO thyristor 2, and by means of the pnp transistor 18 of the turn-on circuit 4, the positive voltage source 16 is connected to the gate of the GTO thyristor 2. This makes the GTO thyristor 2 conducting, and the overvoltage existing at the anode-cathode path of the GTO thyristor 2 is thereby reduced. When the voltage across the GTO thyristor falls below the limit value of the voltage limiting element 28, the control signal or the control current is suppressed. Reduction of the control current causes the receiving portion 34 of the coupling element 32 to go into the blocked state and the enhancement MOSFET 8 becomes conducting, the potential across the gate being limited by the Zener diode 12. Hence the negative voltage source 10 is again connected to the gate of the GTO thyristor 2, whereby the GTO thyristor 2 blocks and is maintained in the blocked state.

Figure 3:
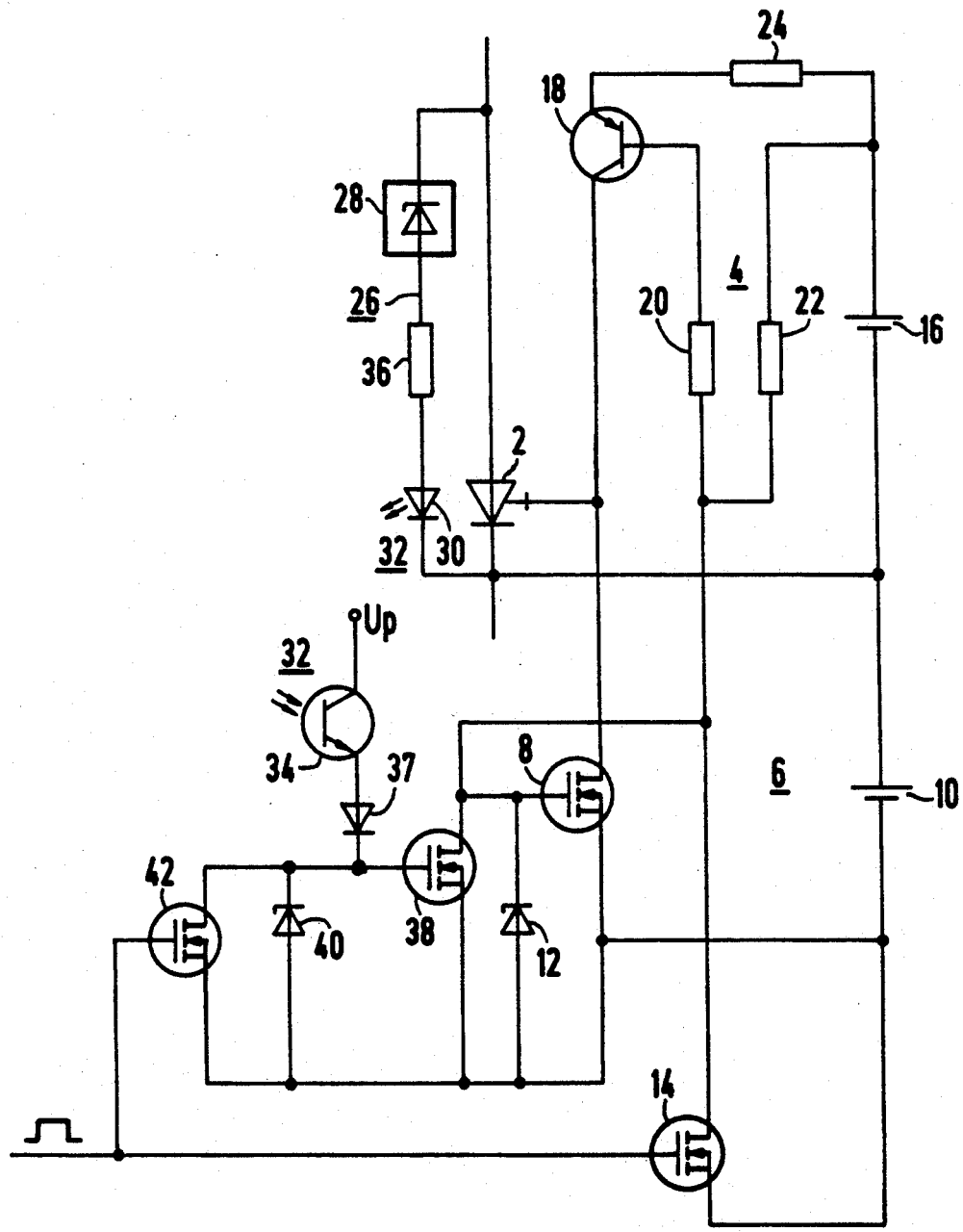

In the system shown in FIG. 3, the receiving portion 34 of the coupling element 32 is electrically connected on the collector side to a positive voltage source $U_p$ and on the emitter side via a decoupling diode 37 to the gate terminal of a enhancement MOSFET 38. By this enhancement MOSFET 38, the gate-source path of MOSFET 8 of the turn-off circuit 6 is bridgeable. In addition, a Zener diode 40 and the drain-source path of a further MOSFET 42 are connected in parallel with the gate-source path of the enhancement MOSFET 38. The gate of this MOSFET 42 is electrically connected to the input of the turn-on circuit 4 (gate of the enhancement MOSFET 14).

As soon as a control signal or a control current is generated in the series arrangement 26, the enhancement MOSFET 38 becomes conducting by means of the coupling element 32, whereby the MOSFET 8 of the turn-off circuit 6 goes into the blocked state and the pnp transistor 18 of the turn-on circuit 4 becomes conducting. This makes the GTO thyristor 2 conducting and the existing overvoltage is reduced. Since a control signal is no longer generated, the negative voltage source 10 is not connected to the gate of the GTO thyristor 2 again, but rather the positive voltage source 16 remains connected at the gate of the GTO thyristor 2. This occurs because the capacitance of the gate-source path of the MOSFET 38 cannot be discharged due to the Zener diode 40 and the decoupling diode 37. To permit this overvoltage protection to be reset, the enhancement MOSFET 42 is provided. Upon the next make command from a control device (not shown in detail), the MOSFETs 14 and 42 become conducting, whereby the pnp transistor 18 is triggered and the gate-source path of MOSFET 38 is bridged, whereby MOSFET 38 blocks. Hence the overvoltage protection system is reset. Thus, make and break commands can be sent continuously from the control device (not shown in detail) to the drive circuit, these commands can also turn the GTO thyristor 2 on and off. If there was no MOSFET 42, the GTO thyristor 2 could no longer be turned off.

Figure 4:
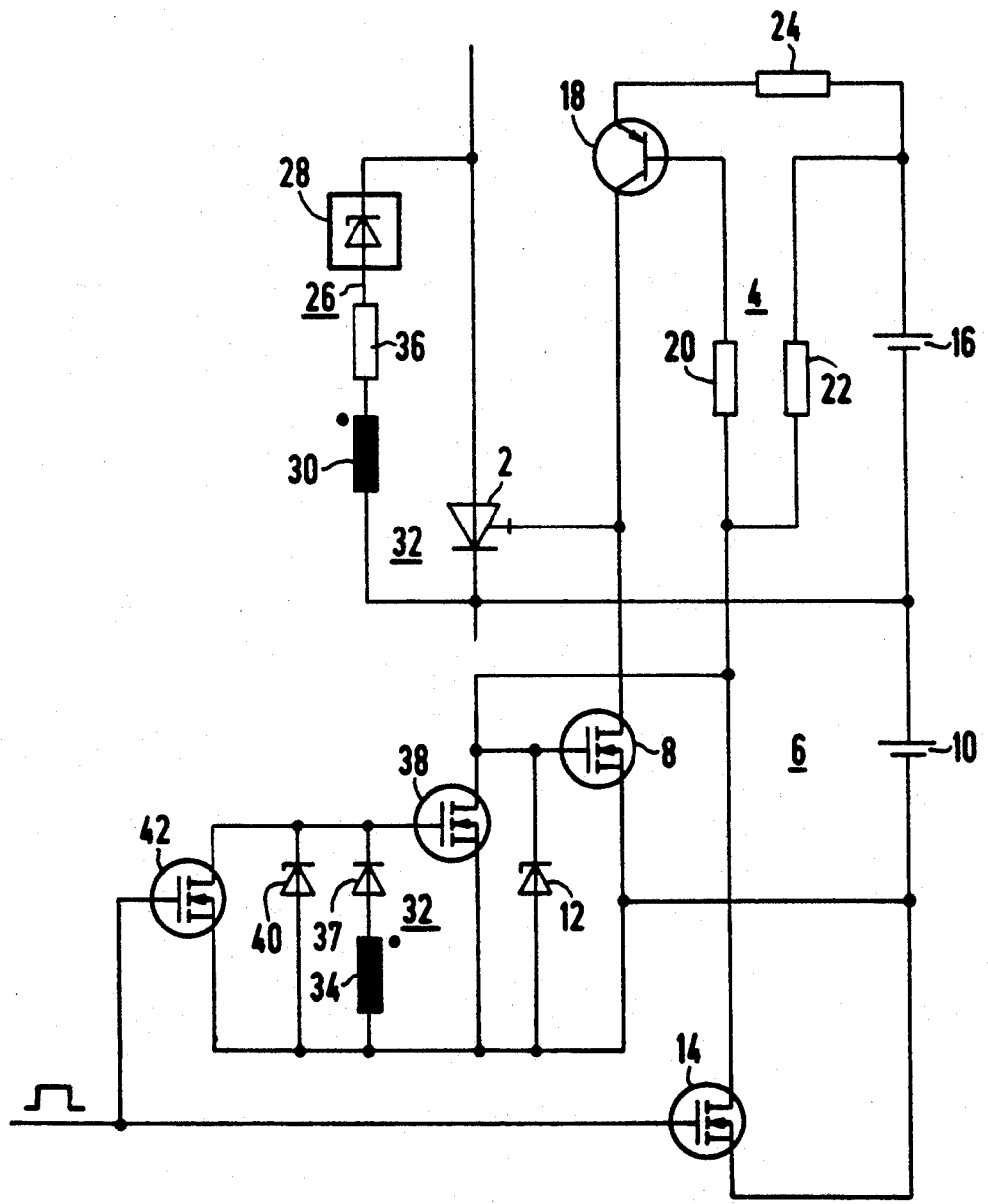

Alternatively, a transformer may be provided as coupling element 32. FIG. 4 shows a system with a transformer as coupling element 32. The receiver portion 34 of the coupling element 32 is connected via the decoupling diode 37 to the gate terminal of the enhancement MOSFET 38. That is, this system corresponds to that of FIG. 3 except for the coupling element 32.

Figure 5:
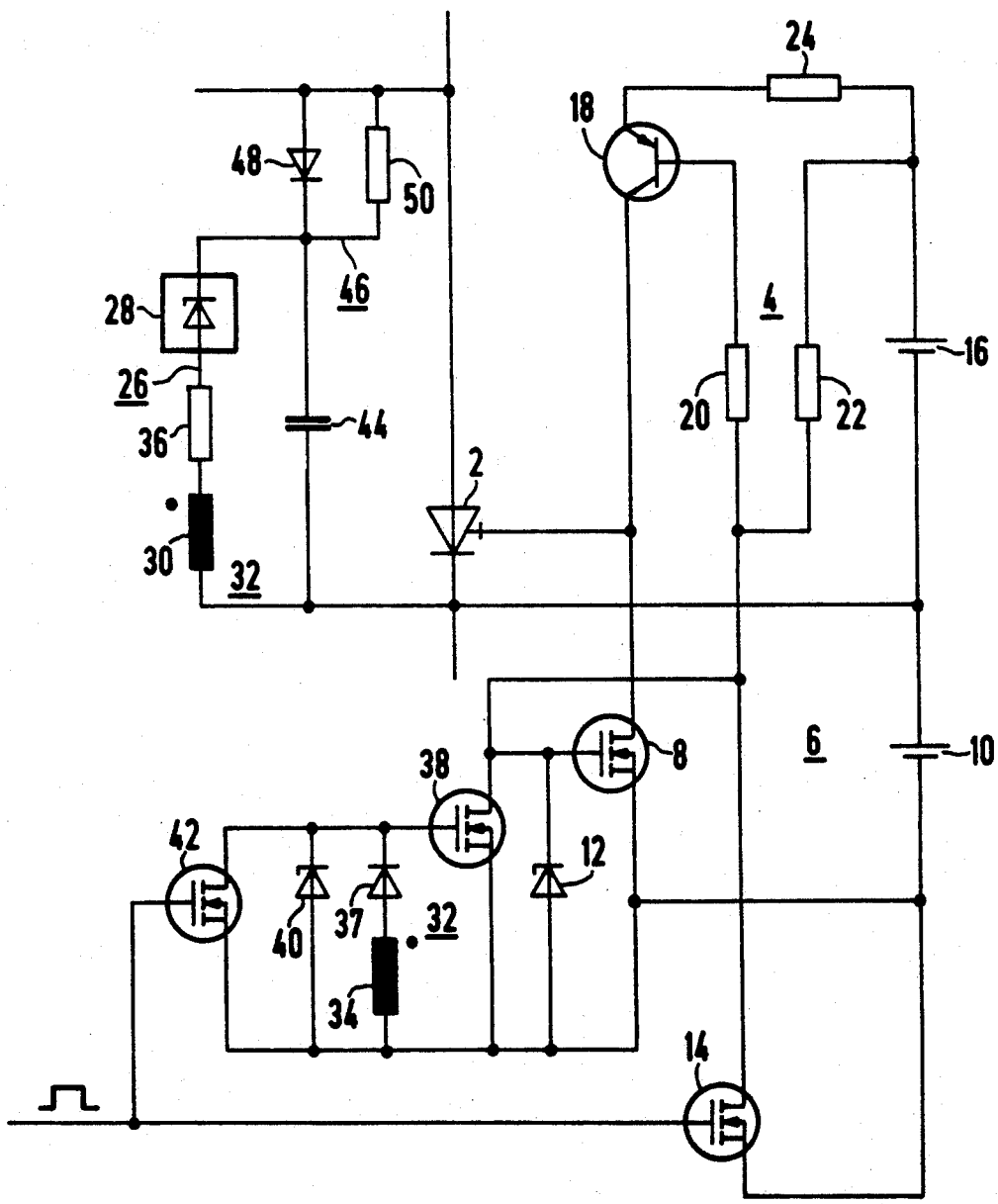

FIG. 5 shows a system according to FIG. 4, in which the voltage-limiting element 28 monitors the voltage across a capacitor 44 of a protective wiring 46 of the GTO thyristor 2 relative to the GTO thyristor's cathode potential. The known protective wiring 46 contains a diode 48 and a resistor 50.

Figure 6:
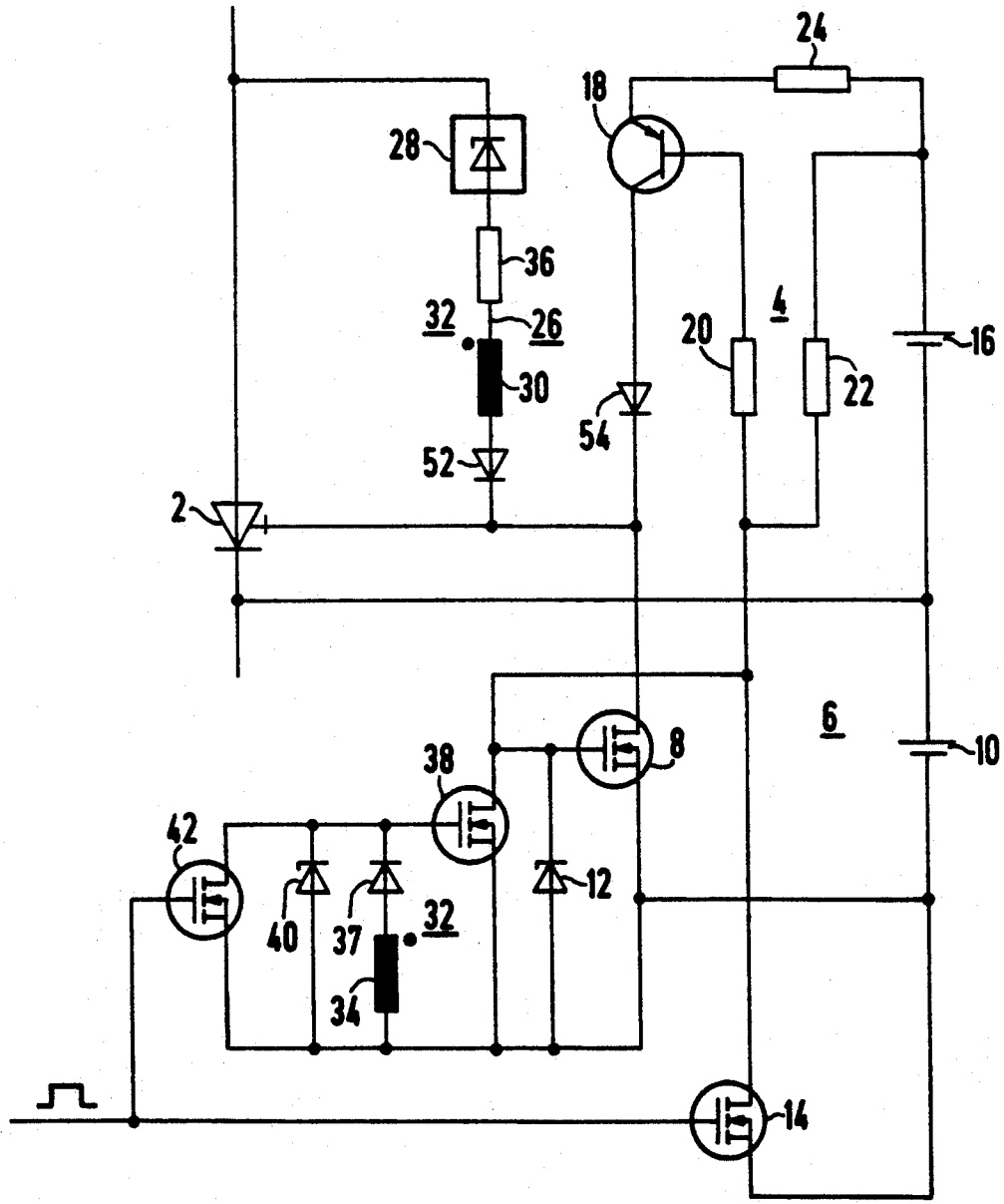
FIGS. 6 and 7 show advantageous forms of the systems of FIGS. 4 and 5.

FIG. 6 shows an advantageous form of realization of the system according to FIG. 4. In this system, the series arrangement 26 is connected in parallel with the anode-gate path of the GTO thyristor 2. When a predetermined voltage limit is exceeded, a control signal or a control current is generated which disconnects the negative voltage source 10 from the gate terminal of the GTO thyristor 2 and connects the positive voltage source 16 to the gate of the GTO thyristor 2. This causes the GTO thyristor 2 to conduct. In addition, the generated control current is supplied as ignition current to the gate of the GTO thyristor 2. This assures that the GTO thyristor 2 is ignited at inadmissible overvoltage even if the turn-on circuit 4 is defective. In order that a gate current generated by the turn-on circuit will not flow off through the series arrangement 26, the series arrangement 26 is expanded by a decoupling diode 52. In addition, the turn-on circuit 4 is decoupled from the gate of the GTO thyristor 2 by a decoupling diode 54.

Figure 7:
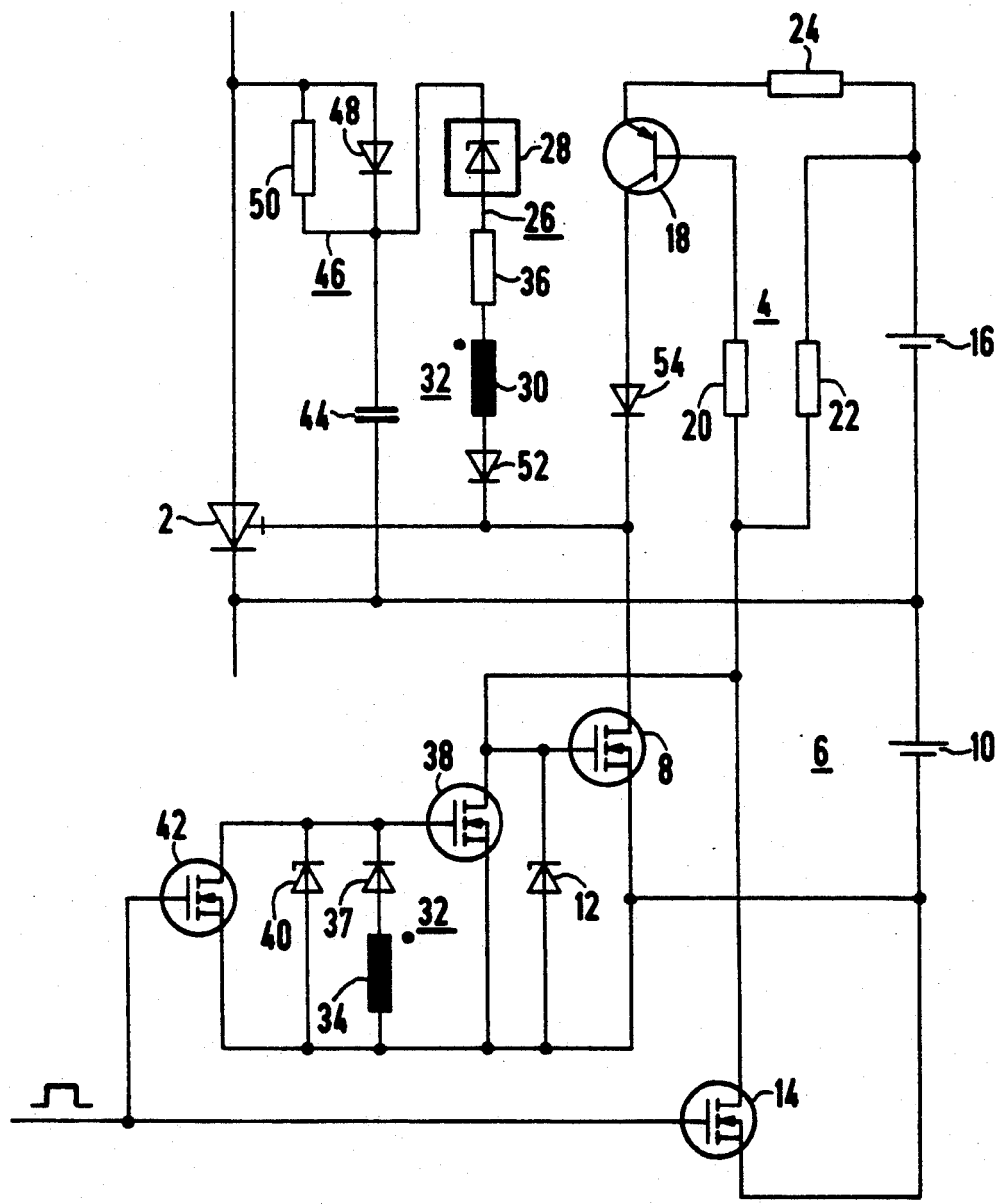

FIG. 7 shows an advantageous realization of the system according to FIG. 5. Also in this system, the generated control signal or respectively the generated control current is additionally supplied as ignition current to the gate of the GTO thyristor 2, so that even in case of failure of the turn-on circuit 4, if an inadmissible overvoltage occurs, it can be reduced by ignition of the GTO thyristor 2.

Figure 8:
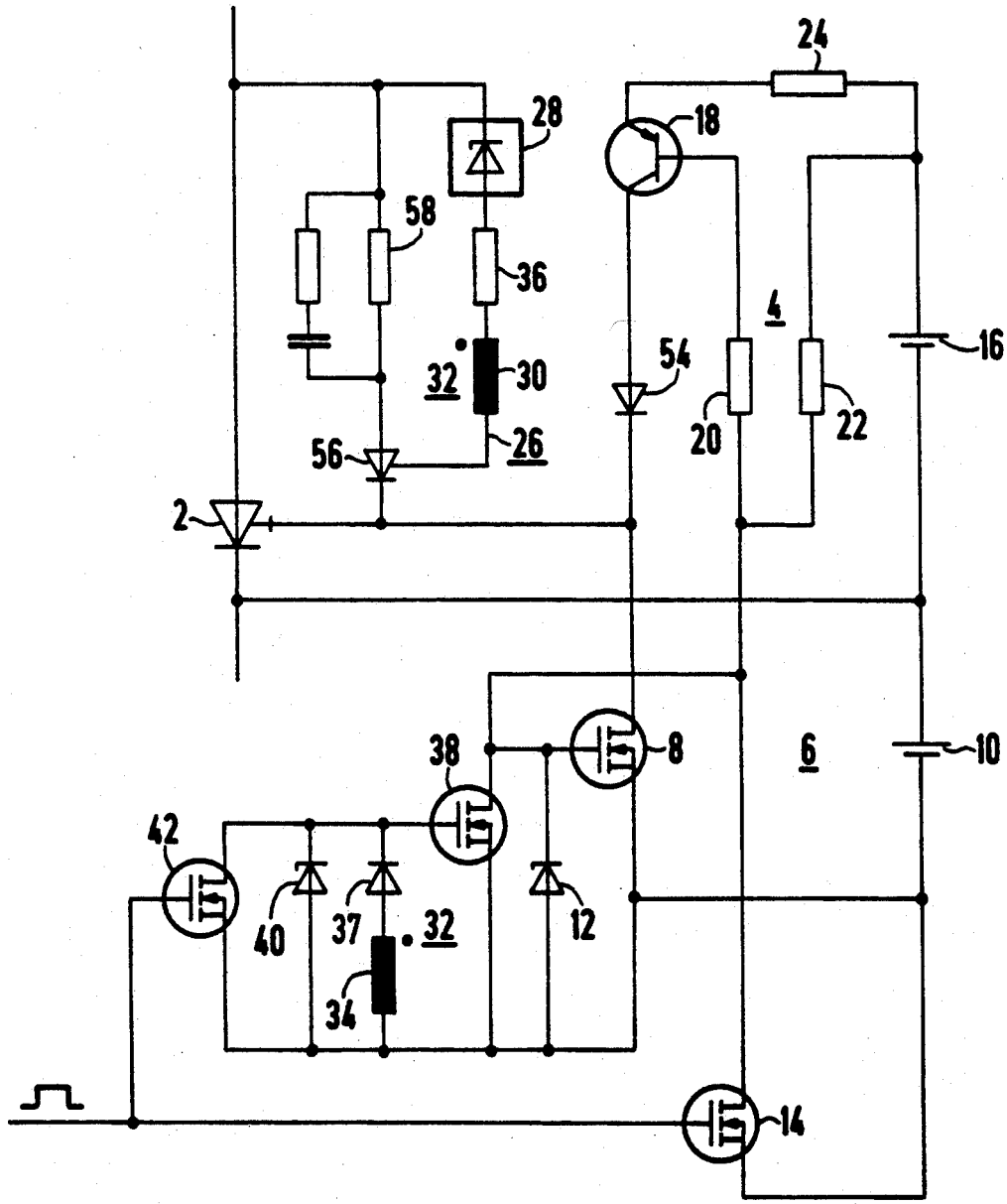
FIGS. 8 and 9 each show an additional system that implements the method of the present invention.

FIG. 8 shows another system for implementing the method of the present invention. In this system there is an ignition thyristor 56 connected in parallel with the anode-gate path of the GTO thyristor 2. The ignition thyristor 56 has a current limiting resistor 58 with parallel R-C wiring. The GTO thyristor 2 may also have a protective wiring 46 according to the system per FIG. 5, in which case the ignition thyristor 56 must be connected to the capacitor 44. The voltage endurance of the ignition thyristor 56 is similar to that of the GTO thyristor 2. The series arrangement 26 with the voltage limiting element 28 and the coupling element 32 is connected in parallel with the anode-gate path of the ignition thyristor 56. As soon as the anode voltage of the GTO thyristor 2 exceeds the predetermined limit, relative to its cathode voltage, a control signal or a control current is generated. By this control signal, the negative voltage source 10 is disconnected from the gate and the positive voltage source 16 is connected to the gate of the GTO thyristor 2. Alternatively, the control current ignites the ignition thyristor 56. With the ignition of the ignition thyristor 56, the generated control current is supplied also to the gate of the GTO thyristor 2 as ignition current, whereby the GTO thyristor 2 fires. Also with this system it is assured that, independently of the state of the turn-on circuit 4, the GTO thyristor 2 is protectively ignited upon occurrence of overvoltages.

Figure 9:
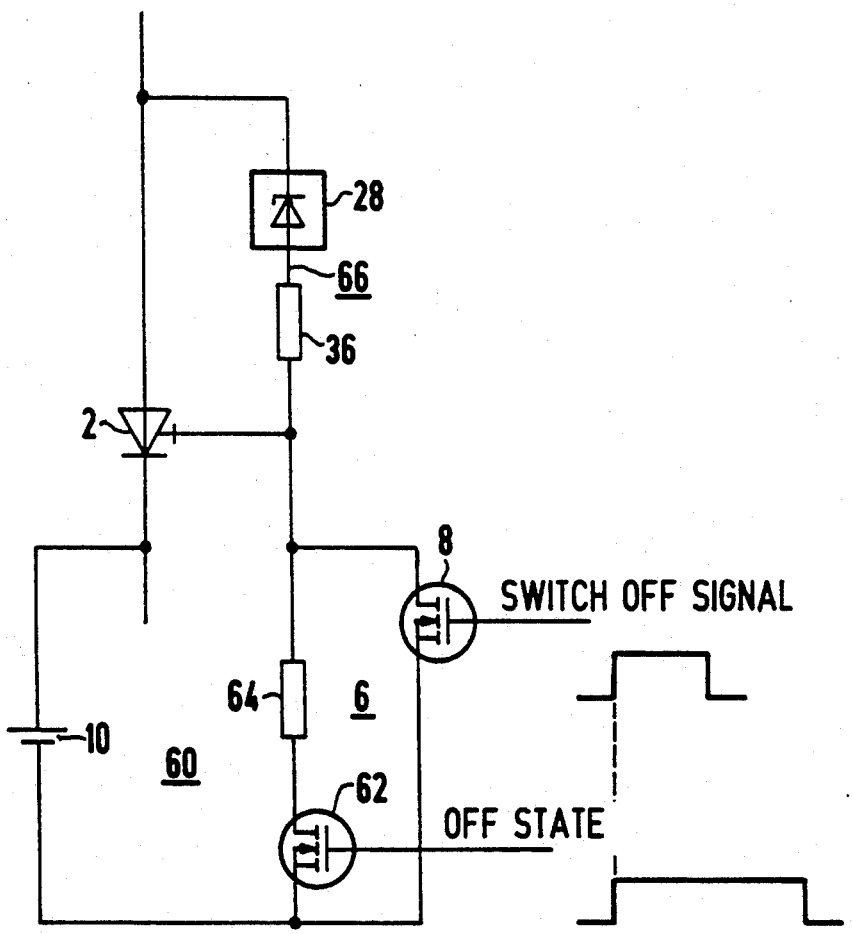

FIG. 9 shows a GTO thyristor 2 whose drive circuit contains, besides the turn-on circuit 4 (not shown in detail), a turn-off circuit 6 and a blocking circuit 60. The turn-off circuit 6 consists of the enhancement MOSFET 8 and the voltage source 10, which can be connected to the gate-source path of the GTO thyristor 2. The blocking circuit 60 consists of a enhancement MOSFET 62 with a drain resistor 64 and the voltage source 10. In addition, a series arrangement 66 is connected in parallel with the anode-gate path of the GTO thyristor 2. This series arrangement consists of a voltage limiting element 28 and a resistor 36. Now if the anode voltage of the GTO thyristor 2 exceeds a predetermined limit, relative to its cathode voltages, the voltage limiting element 28 responds. As the gate-source path of the GTO thyristor 2 has lower impedance than the connected blocking circuit 60, the generated control current flows predominantly as ignition current to the gate of the GTO thyristor 2. The control current ignites the gate of the GTO thyristor 2, whereby the existing overvoltage is reduced. With this system, because the drive circuit of the GTO thyristor 2 has additionally a blocking circuit 60, the negative voltage source 10 need not first be disconnected from the gate when overvoltage occurs.

What is claimed is:

1. A method for protecting a gate fully controlled thyristor against unacceptable overvoltage, in which the gate fully controlled thyristor having a gate is controlled with a drive circuit that includes a turn-on circuit and a turn-off circuit, and a negative voltage source is connected at the gate of the gate fully controlled thyristor, said method comprising:
   a) monitoring the voltage across the gate fully controlled thyristor;
   b) generating a control signal upon overshoot of a predetermined limit by said voltage across the thyristor;
   c) turning off the negative voltage source in response to said control signal;, and
   d) turning on the gate fully controlled thyristor by the turn-on circuit.

2. The method according to claim 1, further comprising, supplying said control signal as an ignition current to the gate of the gate fully controlled thyristor thereby causing the gate fully controlled thyristor to fire.

3. A method for protecting a gate fully controlled thyristor against unacceptable overvoltage, in which the gate fully controlled thyristor having a gate is controlled with a drive circuit including a turn-on circuit, a turn-off circuit, and a blocking circuit, said method comprising:
   a) monitoring the voltage across the gate fully controlled thyristor;
   b) generating a control signal upon overshoot of a predetermined limit by said voltage across the thyristor; and
   c) supplying said control signal as an ignition current to the gate of the gate fully controlled thyristor.

4. A system for protecting a gate fully controlled thyristor against unacceptable overvoltage, in which the gate fully controlled thyristor having a gate is controlled by a drive circuit that includes a turn-off circuit with an actuating input, and a turn-on circuit, the system comprising:
   a) a coupling element including a transmitting portion, and a receiving portion connected to the actuating input;
   b) a negative voltage source connected to the gate of the gate fully controlled thyristor;
   c) a voltage limiting element in series with said transmitting portion forming a series arrangement, which is connected in parallel with the gate fully controlled thyristor, whereby said actuating input turns the turn-off circuit off and the turn-on circuit on, thereby turning on the gate fully controlled thyristor.

5. The system of claim 4, wherein said voltage-limiting element comprises a breakover diode.

6. The system of claim 4, wherein said voltage-limiting element comprises a varistor and a trigger diode connected in series.

7. The system of claim 4, wherein said voltage-limiting element comprises a Zener diode and a trigger diode connected in series.

8. A system for protecting a gate fully controlled thyristor against unacceptable overvoltage, in which the gate fully controlled thyristor has a gate, a protective circuit including a diode, a resistor, and a capacitor, and is controlled by a drive circuit that includes a turn-off circuit having a switch with an actuating input, and a turn-on circuit; the system comprising:
   a) a coupling element including a transmitting portion, and a receiving portion being connected to said actuating input;
   b) a negative voltage source connected to the gate of the gate fully controlled thyristor;
   c) a voltage limiting element in series with said transmitting portion forming a series arrangement, which is connected in parallel with said capacitor, whereby said actuating input turns the turn-off circuit off and the turn-on circuit on, thereby turning on the gate fully controlled thyristor.

9. The system of claim 8, wherein said switch comprises a resettable switch.

10. The system of claim 8, wherein said coupling element comprises a transformer.

11. The circuit of claim 8, wherein said switch comprises a enhancement metal oxide semiconductor field effect transistor (MOSFET), and further comprising:
   a) a Zener diode being connected in parallel with a gate-emitter path of said MOSFET; and
   b) a second decoupling diode being connected in series with said receiving portion, and a resultant series combination of said second decoupling diode and said receiving portion being connected in parallel with said Zener diode.

12. The system of claim 11, further comprising a second enhancement MOSFET bridging the gate-emitter path of said first enhancement MOSFET, and a gate of the second enhancement MOSFET linked with an input of the turn-on circuit.

13. The system of claim 8, wherein said voltage-limiting element comprises a breakover diode.

14. The system of claim 8, wherein said voltage-limiting element comprises a varistor and a trigger diode connected in series.

15. The system of claim 8, wherein said voltage-limiting element comprises a Zener diode and a trigger diode connected in series.

16. A system for protecting a gate fully controlled thyristor against unacceptable overvoltage, in which the gate fully controlled thyristor having a gate is controlled by a drive circuit that includes a turn-off circuit having a switch with an actuating input, and a turn-on circuit, the system comprising;
   a) a coupling element including a transmitting portion, and a receiving portion being connected to said actuating input;
   b) a voltage limiting element in series with said transmitting portion and a first decoupling diode forming a series arrangement, which links the gate of the gate fully controlled thyristor with an anode of the gate fully controlled thyristor, whereby said actuating input turns the turn-off circuit off and the turn-on circuit on, thereby turning on the gate fully controlled thyristor.

17. The system of claim 16, wherein said switch comprises a resettable switch.

18. The system of claim 16, wherein said coupling element comprises a transformer.

19. The circuit of claim 16, wherein said switch comprises a enhancement metal oxide semiconductor field effect transistor (MOSFET), and further comprising:
   a) a Zener diode being connected in parallel with a gate-emitter path of said MOSFET; and
   b) a second decoupling diode being connected in series with said receiving portion, and a resultant series combination of said second decoupling diode and said receiving portion being connected in parallel with said Zener diode.

20. The system of claim 19, further comprising a second enhancement MOSFET bridging the gate-emitter path of said first enhancement MOSFET, and a gate of the second enhancement MOSFET linked with an input of the turn-on circuit.

21. The system of claim 16, wherein said voltage limiting element comprises a breakover diode.

22. The system of claim 16, wherein said voltage-limiting element comprises a varistor and a trigger diode connected in series.

23. The system of claim 16, wherein said voltage-limiting element comprises a Zener diode and a trigger diode connected in series.

24. A system for protecting a gate fully controlled thyristor against unacceptable overvoltage, in which the gate fully controlled thyristor has a gate, a protective circuit including a diode, a resistor, and a capacitor, and is controlled by a drive circuit that includes a turn-off circuit having a switch with an actuating input, and a turn-on circuit, the system comprising;
   a) a coupling element including a transmitting portion, and a receiving portion being connected to said actuating input;
   b) a voltage limiting element in series with said transmitting portion and a first decoupling diode forming a series arrangement, which links the gate of the gate fully controlled thyristor with an anode of the capacitor, whereby said actuating input turns the turn-off circuit off and the turnon circuit, thereby turning on the gate fully controlled thyristor.

25. The system of claim 24, wherein said switch comprises a resettable switch.

26. The system of claim 24, wherein said coupling element comprises a transformer.

27. The circuit of claim 24, wherein said switch comprises a enhancement metal oxide semiconductor field effect transistor (MOSFET), and further comprising:
   a) a Zener diode being connected in parallel with a gate-emitter path of said MOSFET; and
   b) a second decoupling diode being connected in series with said receiving portion, and a resultant series combination of said second decoupling diode and said receiving portion being connected in parallel with said Zener diode.

28. The system of claim 27, further comprising a second enhancement MOSFET bridging the gate-emitter path of said first enhancement MOSFET, and a gate of the second enhancement MOSFET linked with an input of the turn-on circuit.

29. The system of claim 24, wherein said voltage limiting element comprises a breakover diode.

30. The system of claim 24, wherein said voltage-limiting element comprises a varistor and a trigger diode connected in series.

31. The system of claim 24, wherein said voltage-limiting element comprises a Zener diode and a trigger diode connected in series.

32. A system for protecting a gate fully controlled thyristor against unacceptable overvoltage, in which the gate fully controlled thyristor having a gate is controlled by a drive circuit that includes a turn-off circuit having a switch with an actuating input, and a turn-on circuit, the system comprising;
   a) a coupling element including a transmitting portion, and a receiving portion being connected to said actuating input;
   b) an ignition thyristor with a series resistor being connected in parallel with the gate and anode of the gate fully controlled thyristor;
   c) a resistor-capacitor series circuit being connected in parallel with said series resistor;
   d) a voltage limiting element in series with said transmitting portion forming a series arrangement, which links a gate of the ignition thyristor with an anode of the gate fully controlled thyristor, whereby said actuating input turns the turn-off circuit off and the turn-on circuit on, thereby turning on the gate fully controlled thyristor.

33. The system of claim 32, wherein said switch comprises a resettable switch.

34. The system of claim 32, wherein said coupling element comprises a transformer.

35. The circuit of claim 32, wherein said switch comprises a enhancement metal oxide semiconductor field effect transistor (MOSFET), and further comprising:
   a) a Zener diode being connected in parallel with a gate-emitter path of said MOSFET; and
   b) a second decoupling diode being connected in series with said receiving portion, and a resultant series combination of said second decoupling diode and said receiving portion being connected in parallel with said Zener diode.

36. The system of claim 32, further comprising a second enhancement MOSFET bridging the gate-emitter path of said first enhancement MOSFET, and a gate of the second enhancement MOSFET linked with an input of the turn-on circuit.

37. The system of claim 32, wherein said voltage limiting element comprises a breakover diode.

38. The system of claim 32, wherein said voltage-limiting element comprises a varistor and a trigger diode connected in series.

39. The system of claim 32, wherein said voltage-limiting element comprises a Zener diode and a trigger diode connected in series.

40. A system for protecting a gate fully controlled thyristor against unacceptable overvoltage, in which the gate fully controlled thyristor having a gate is controlled by a drive circuit that includes a turn-off circuit, a turn-on circuit, and a blocking circuit, the system comprising a voltage limiting element in series with a resistor forming a series arrangement, which is connected in parallel with an anode-gate path of the gate fully controlled thyristor, wherein the blocking circuit comprises a switch, a blocking circuit resistor and a negative voltage source, said blocking circuit resistor having a resistance much larger than the resistance of the gatecathode-path of the gate fully controlled thyristor.

41. The system of claim 40, wherein said voltage limiting element comprises a breakover diode.

42. The system of claim 40, wherein said voltage-limiting element comprises a varistor and a trigger diode connected in series.

43. The system of claim 40, wherein said voltage-limiting element comprises a Zener diode and a trigger diode connected in series.

* * * * *